United States Patent
Miyata et al.

(10) Patent No.: US 8,435,899 B2
(45) Date of Patent: May 7, 2013

(54) METHOD FOR PRODUCING COLUMNAR STRUCTURED MATERIAL

(75) Inventors: Hirokatsu Miyata, Hadano (JP); Albrecht Otto, Atsugi (JP); Akira Kuriyama, Atsugi (JP); Miki Ogawa, Tokyo (JP); Hiroshi Okura, Hiratsuka (JP); Kazuhiko Fukutani, Santa Cruz, CA (US); Tohru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 472 days.

(21) Appl. No.: 12/555,195

(22) Filed: Sep. 8, 2009

(65) Prior Publication Data

US 2010/0003822 A1    Jan. 7, 2010

Related U.S. Application Data

(62) Division of application No. 10/538,127, filed as application No. PCT/JP03/15949 on Dec. 12, 2003, now abandoned.

(30) Foreign Application Priority Data

Dec. 13, 2002    (JP) .................................. 2002-363130

(51) Int. Cl.
   *H01L 21/311*    (2006.01)
(52) U.S. Cl.
   USPC .............. 438/694; 438/688; 438/478; 216/11
(58) Field of Classification Search .................. 136/205; 205/118, 171, 333; 216/11; 257/1, 14, 17, 257/3, 621, 746, 758, 9; 313/309, 310, 495; 324/694; 427/162; 428/137, 304.4, 312.2, 428/457, 642, 66.6, 478, 694
See application file for complete search history.

(56) References Cited

U.S. PATENT DOCUMENTS 2,508,008 A * 5/1950 Block ........................... 420/548
5,049,978 A * 9/1991 Bates et al. .................... 257/686
(Continued)

FOREIGN PATENT DOCUMENTS

JP    9-157062 A    6/1997
JP    2000-1392 A   1/2000
(Continued)

OTHER PUBLICATIONS

Kunces, Electroless Plating-Fundamentals and Applications, 1990 William Andrew Publishing pp. 511-517.*

(Continued)

*Primary Examiner* — Duy Deo
*Assistant Examiner* — Erin Bergner
(74) *Attorney, Agent, or Firm* — Fitzpatrick, Cella, Harper & Scinto

(57) ABSTRACT

A microcolumnar structured material having a desired material. The columnar structured material includes columnar members obtained by introducing a filler into columnar holes formed in a porous material. The porous material has the columnar holes formed by removing columnar substances from a structured material in which the columnar substances containing a first component are dispersed in a matrix member containing a second component capable of forming a eutectic with the first component. The matrix member may be removed. In the columnar structured material, the filler is a conductive material, and an electrode can be structured by electrically connecting the conductive materials in at least a part of a plurality of holes to a conductor.

5 Claims, 8 Drawing Sheets

U.S. PATENT DOCUMENTS

| | | | |
|---|---|---|---|
| 5,202,290 A * | 4/1993 | Moskovits | 438/478 |
| 5,581,091 A | 12/1996 | Moskovits et al. | |
| 5,824,622 A | 10/1998 | Harmer et al. | |
| 6,027,796 A * | 2/2000 | Kondoh et al. | 428/312.8 |
| 6,129,901 A * | 10/2000 | Moskovits et al. | 423/447.3 |
| 6,185,961 B1 | 2/2001 | Tonucci et al. | |
| 6,231,744 B1 * | 5/2001 | Ying et al. | 205/324 |
| 6,278,231 B1 | 8/2001 | Iwasaki et al. | |
| 6,309,554 B1 | 10/2001 | Fujishima et al. | |
| 6,359,288 B1 | 3/2002 | Ying et al. | |
| 7,074,480 B2 | 7/2006 | Fukutani et al. | |
| 7,183,127 B2 | 2/2007 | Kuriyama et al. | |
| 7,192,510 B2 | 3/2007 | Den et al. | |
| 7,348,670 B2 | 3/2008 | Den et al. | |
| 7,393,458 B2 * | 7/2008 | Fukutani et al. | 216/56 |
| 7,517,554 B2 | 4/2009 | Saito et al. | |
| 2001/0028872 A1 * | 10/2001 | Iwasaki et al. | 423/447.3 |
| 2002/0109134 A1 | 8/2002 | Iwasaki et al. | |
| 2002/0118027 A1 | 8/2002 | Routkevitch et al. | |
| 2003/0147801 A1 | 8/2003 | Someya et al. | |
| 2006/0032526 A1 | 2/2006 | Fukutani et al. | |
| 2006/0192309 A1 | 8/2006 | Fukutani et al. | |

FOREIGN PATENT DOCUMENTS

| | | |
|---|---|---|
| JP | 2000-327491 A | 11/2000 |
| JP | 2002-346999 A | 12/2002 |
| WO | 01/71394 A1 | 9/2001 |

OTHER PUBLICATIONS

N.E. Sluchanko, et. al., "Late Stages of Phase Separation in Al1-xSix Solid Solutions," Physical Review B, vol. 53(17), pp. 11304-11306 (May 1996).

Hideki Masuda et al., "Preparation of Microporous Gold Films by Two-Step Replicating Process Using Anodic Alumina as Template," 66(1) Bull. Chem. Soc. Jpn. 305-11 (1993).

* cited by examiner

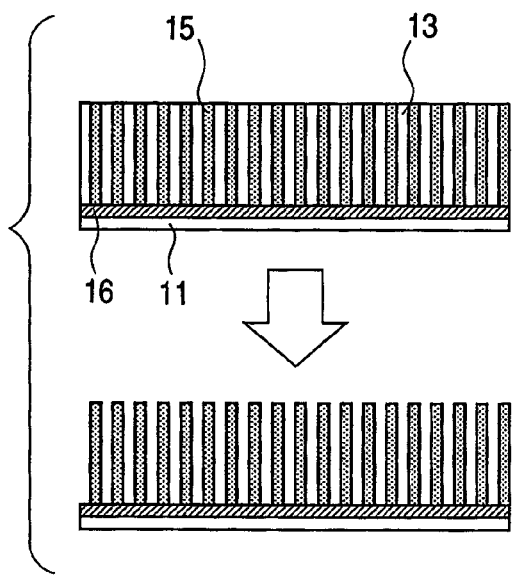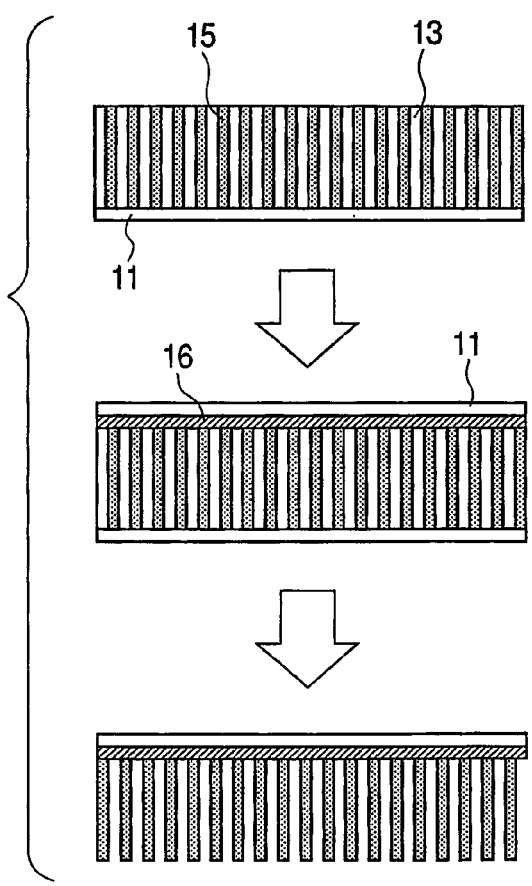
FIG. 8A
FIG. 8B

METHOD FOR PRODUCING COLUMNAR STRUCTURED MATERIAL

CROSS-REFERENCE TO RELATED APPLICATIONS

This application is a division of application Ser. No. 10/538,127, which is the U.S. national stage of PCT/JP2003/015949, filed Dec. 12, 2003, and which is incorporated herein by reference.

TECHNICAL FIELD

The present invention relates to a columnar structured material, an electrode having the columnar structured material, and a production method therefor, and particularly to a structured material that includes microcolumnar forms and is applicable to a semiconductor device or an electrode, an electrode having the columnar structured material, and a production method therefor. More specifically, the invention relates to a structured material that includes microcolumnar forms and employs a porous material formed to have microholes by self-organization, an electrode having the columnar structured material, and a production method therefor. Still more specifically, the invention relates to a structured material that includes microcolumnar forms and employs a porous material produced to have microholes from a nanostructured material formed by self-organization using eutectic materials, an electrode having the columnar structured material, and a production method therefor.

BACKGROUND ART

Semiconductor processing techniques have been making remarkable progress, and processing techniques with precision of the order of 100 nm are about to become commercially practical. As semiconductor devices decrease in size, switching speeds increase while power consumption decreases. Thus, downsizing of semiconductor devices is essential for the production of high-performance LSIs. Up to now, the packing density of semiconductor devices has linearly increased with each passing year. However, it is a matter of time that the processing precision reaches the limit of photolithography in conventional use, so that the development of an alternative processing process is an urgent necessity.

As a processing process exceeding the limit of the photolithography in conventional use, more attention is being paid to a process for causing spontaneous production of a microstructure utilizing properties of a material or the like based on so-called self-organization. The microstructure formed by self-organization exhibits a wide variety of forms such as a layer form, a fiber form, a columnar form, a spherical form, and a porous form, and potential applications are proposed for the respective forms. Above all, porous thin films formed on a substrate and columnar structured materials particularly have a wide field of industrial applications, being considered as the most promising applications.

Among the most noteworthy applications of the porous thin films are alumina nanoholes formed by anodizing aluminum. The alumina nanoholes are obtained by anodizing an aluminum thin film under given conditions as microholes formed perpendicularly to the surface due to electrostatic focus.

As other significant materials, there are thin films of mesoporous materials produced by a sol-gel process or the like with a surfactant aggregate being used as a mold. Those materials are obtained by producing materials having a regular microhole structure by such a simple method as dip coating, and are provided with microholes arranged in parallel to substrates.

Meanwhile, as to the columnar structured materials, there are many materials being under study. The production methods for the columnar structured material are broadly divided into two methods. One is a method (first method) of producing a structured material having a columnar structure directly onto a substrate. The other is a method (second method) of forming an object material within microholes formed in a porous material and then removing the porous material.

First, description is made of the first method. As the method of forming a columnar structured material directly onto a substrate, there are a method of performing deposition from a liquid phase and a method of performing growth from a vapor phase. The method of performing deposition from a liquid phase is used to form the columnar structured material of $ZnO$, $TiO_2$, or the like with a relatively low aspect ratio. As the method of performing growth from a vapor phase, which is used more generally, there are a method of performing vapor deposition directly on a raw material, a method of performing growth by catalytic reaction using a Vapor-Liquid-Solid mechanism, a method using Chemical Vapor Deposition (CVD), and the like. For example, it has been reported that a catalyst such as gold can be used to grow a needle crystal of zinc oxide on a substrate. Those methods are used to obtain the columnar structured materials of a metal, a semiconductor, or the like with a high aspect ratio on a substrate.

Next, description is made of the second method. As a porous material used in this method, the microholes preferably have a linear form without having a branch. For example, the above-mentioned alumina nanoholes and mesoporous materials can be used. As to the use of the alumina nanoholes, for example, by using a conductive material as a base substrate under a nanohole film, the object material is introduced into the microholes by such a method as electrodeposition, and alumina is finally removed to produce the columnar structured material. When such a method as electrodeposition is used, it is also possible to produce a columnar structured material different in compositions from the middle of the process. In the case of the mesoporous materials, the columnar structure can be formed by a method of adsorbing a precursor of the object material and then using chemical treatment for an object composition, a CVD method, or the like. In the case of using the mesoporous materials, a longitudinal direction of the columnar structure becomes parallel to the substrate. Adjacent columns are joined by a microfine wire. There is an example having description of platinum as to the production of the columnar structured material using the mesoporous materials.

(Prior Art Relating to Electrode)

As a detection method for molecules, ions, and the like dissolved in a solution, an electrochemical measuring method for performing a measurement of a current value in accordance with the transfer of electrode electrons is used, and is currently being put into application in various fields.

In particular, in a measurement for micro detection or the like, it is important to obtain a current response within a given observation area with high precision and high sensitivity. In order to achieve this object, attention is being given to enlargement of a surface area of an electrode and regulation of a structured material.

In recent years, there is proposed a production method for an electrode having a columnar structured material to which photolithography is applied. Known examples of this method include: a lift-off process in which a resist is applied to a substrate, a photomask having an electrode pattern is superposed thereon, exposure and development are performed, a metal thin film is then formed by vapor deposition or the like, and the resist is peeled off to obtain a microelectrode on the substrate; and an etching process in which a metal thin film is produced on an insulating substrate, a resist is then subjected to application, exposure, and development in this order, and a residual resist is further used as a mask to subject the metal thin film in an exposed portion to etching to obtain an electrode pattern. With the above method, a large number of microelectrodes having an arbitrary form and a predetermined interelectrode distance can be produced on a substrate with high reproducibility.

However, the photolithography in current use has a limit of precision of the order of approximately 100 nm. Therefore, as a processing process exceeding the limit of the photolithography, more attention is being paid to a process for causing spontaneous production of a microstructure utilizing properties of a material or the like based on so-called self-organization. A method of producing an electrode having a columnar structure of the order of 100 nm or less by using the self-organization is broadly divided into two methods. One is the above-mentioned first method of forming a columnar structured material directly onto a substrate, and the other is the above-mentioned second method of forming an object material within microholes formed in a porous material and then removing the porous material. Description is further made of reported examples of use of the second method that has been already described to produce an electrode having a columnar structured material for detection with high precision and high sensitivity. For example, it is reported in Bull. Chem. Soc. Jpn., 66, 305(1993) that alumina nanoholes are used for a mold to deposit Ni by electrolysis, and in Japanese Patent Application Laid-Open No. 2000-001392 that alumina nanoholes are used for a mask to deposit a metal, and the metal is used as a catalyst to grow a columnar structured material and obtain an electrode.

However, the above-mentioned respective methods of producing a columnar structured material have problems as described below.

First, in the method of forming a columnar structured material directly from a liquid phase, applicable materials are limited. For example, in the case of using electrodeposition, wide-range materials such as metals are formed mainly into a form of a continuous film. Further, even in the case where a material can be formed into a columnar structure, it is difficult to orient its direction so as to be completely perpendicular to a substrate. Even a single column of the columnar structured material often has its proximal end and its distal end varied in diameter. In the method of forming a columnar structured material directly from a vapor phase, a process performed at high temperature becomes necessary in many cases, so that only such a substrate that can withstand a formation temperature for the object columnar structured material can be applied. Also, in the case of using catalytic reaction, a specific material of a noble metal or the like needs to be formed on a surface of the substrate, causing problems with a configuration of the structured material and production cost. In this case as well, a single column of the columnar structured material often has its proximal end and its distal end varied in diameter. Meanwhile, in the method of producing a columnar structured material by introducing a material into alumina nanoholes, it is substantially impossible in actuality to set the diameter of a microhole among the alumina nanoholes to 10 nm or less. Thus, it is difficult to control the diameter of the formable columnar structured material to 10 nm or less, and a technique for producing a columnar structured material having a further smaller diameter is desired. In many cases, it is when the size becomes less than 10 nm that the material is released from bulk properties and develops specific properties such as a quantum size effect. Therefore, it has been a significant problem to produce a columnar structured material having a diameter of less than 10 nm.

Further, in the method of producing a columnar structured material by introducing a material into a mesoporous material, obtained microholes are sufficiently small in diameter, but an orientation of the microholes is parallel to the substrate. Thus, it is difficult to apply a process with ease and high reliability such as electrodeposition for introducing the material into the microholes.

DISCLOSURE OF THE INVENTION

The present invention has been made in view of the above problems, and has an object to provide: a columnar structured material that is perpendicular to a substrate, has almost no change in diameter in a longitudinal direction, and is finely structured with, for example, a diameter of less than 10 nm; and a production method that is capable of producing the columnar structured material with a simple method, and applicable to wide-range materials.

Further, the present invention has another object to provide: an electrode which includes a columnar structured material provided on a conductive material with a columnar structured material that is perpendicular to a substrate, has almost no change in diameter in a longitudinal direction, and is finely structured with, for example, a diameter of less than 10 nm, and which is capable of measuring a current value with high sensitivity and high precision; and a method of producing the electrode with a simple method.

A columnar structured material according to a first invention of the present application is a columnar structured material which is obtained by introducing a filler into columnar holes formed in a porous material, in which the porous material has the columnar holes formed by removing columnar substances from a structured material in which the columnar substances containing a first component are dispersed in a matrix member containing a second component capable of forming a eutectic with the first component.

Further, a columnar structured material according to a second invention of the present application is a columnar structured material, in which the matrix member is removed from the columnar structured material according to the first invention.

In the present invention, it is preferable that the structured material has a thin film form.

Further, in the present invention, the columnar structured material is obtained by introducing the filler into the columnar holes after subjecting the porous material to chemical treatment. In particular, it is preferable that the chemical treatment is oxidation treatment.

Further, in the present invention, it is preferable that the columnar substance is aluminum, the matrix member is silicon, and the proportion of silicon to the structured material is in a range from 20 atomic % to 70 atomic %. Further, in the present invention, it is preferable that the columnar substance is aluminum, the matrix member is germanium, and the proportion of germanium to the structured material is in the range from 20 atomic % to 70 atomic %.

Further, in the present invention, it is preferable that a main component of the porous material is silicon or germanium.

Further, in the present invention, it is preferable that a diameter of a filler region of the columnar structured material is in a range from 0.5 nm to 15 nm. Further, in the present invention, it is preferable that an interval between filler regions of the columnar structured material is in a range from 5 nm to 20 nm.

Further, in the present invention, it is preferable that the columnar substance is a crystalline substance, and the matrix member is an amorphous substance.

Further, in the present invention, it is preferable that the filler introduced into the holes of the porous material is a metal or a semiconductor.

An electrode according to a third invention of the present application is an electrode having the columnar structured material according to the second invention, in which the filler is a conductive material, the conductive materials in at least a part of a plurality of holes being electrically connected to a conductor.

A production method for a columnar structured material according to a fourth invention of the present application is characterized by including: a step of preparing a structured material in which columnar substances containing a first component are dispersed in a matrix member containing a second component capable of forming a eutectic with the first component; a removing step of removing the columnar substances; and an introducing step of introducing a filler into columnar holes that are formed in a porous material in the removing step.

A production method for a columnar structured material according to a fifth invention of the present application includes a removing step of removing the matrix member after the introducing step.

In the present invention, it is preferable that the production method includes a step of subjecting the porous material to chemical treatment after the removing step. It is preferable that the chemical treatment is oxidation treatment.

Further, in the present invention, it is preferable that the removing step is performed by etching.

Further, in the present invention, it is preferable that the introducing step is performed by electrodeposition.

Further, in the present invention, it is preferable that the introducing step is performed by electroless deposition.

Further, in the present invention, it is preferable that the introducing step is performed by catalytic reaction after forming a catalyst in a bottom portion of the hole.

A production method for an electrode having a columnar structured material according to a sixth invention of the present application is a production method for an electrode having a columnar structured material that is produced by the production method according to the fifth invention of the present application, in which in the step of preparing a structured material, the structured material is formed on a substrate having a surface at least a part of which is a conductive surface, and the filler is a conductive material.

A production method for an electrode having a columnar structured material according to a seventh invention of the present application is a production method for an electrode having a columnar structured material that is produced by the production method according to the fifth invention of the present application, which includes, between the introducing step and the removing step, a step of providing the porous material into which the filler is introduced onto a substrate having a surface at least a part of which is a conductive surface, and in which the filler is a conductive material.

BRIEF DESCRIPTION OF THE DRAWINGS

FIGS. 8A and 8B are schematic diagrams for explaining two production steps of the electrode having the columnar structured material according to the present invention.

BEST MODE FOR CARRYING OUT THE INVENTION

Hereinafter, embodiments of the present invention will be described with reference to the drawings.

Embodiment Regarding Columnar Structured Material

In the case where a film of a plurality of substances each included in a eutectic system is formed on a substrate by a method such as, for example, sputtering, respective components are independently present in the film without being mixed. In the case where film forming conditions and compositions of the substances are optimized for a specific material system, given components are formed into a columnar form having a minute diameter to form a structure in which the given components are dispersed within a matrix member of other components. The structure is a novel structured material discovered by the inventors of the present invention, in which columnar substances are present so as to penetrate from a substrate interface to a film surface. The diameter of one column of the formed columnar substances is in a range from 0.5 nm to 15 nm. Also, the interval between the columnar substances is in a range from 5 nm to 20 nm.

A specific example is used for explanation. In the case of producing a mixture film of aluminum and silicon on the substrate by sputtering, if the conditions are optimized, crystalline aluminum columns are formed in the matrix member of amorphous silicon. It is indicated by observation using a scanning electron microscope that aluminum is present in the film as a single column extending from the substrate interface to the film surface. The similar structure is verified to be formed using a mixture film of aluminum and germanium produced by sputtering. The film thickness can be controlled by adjusting the period of time for sputtering. Even if the film thickness is increased, a columnar structure does not end at some midpoint as long as the sputtering is not interrupted.

According to this embodiment, a columnar structured material of a desired composition can be produced by removing the aluminum substances from the film containing the above aluminum substances and introducing a desired material into resultant holes.

Figure 1:
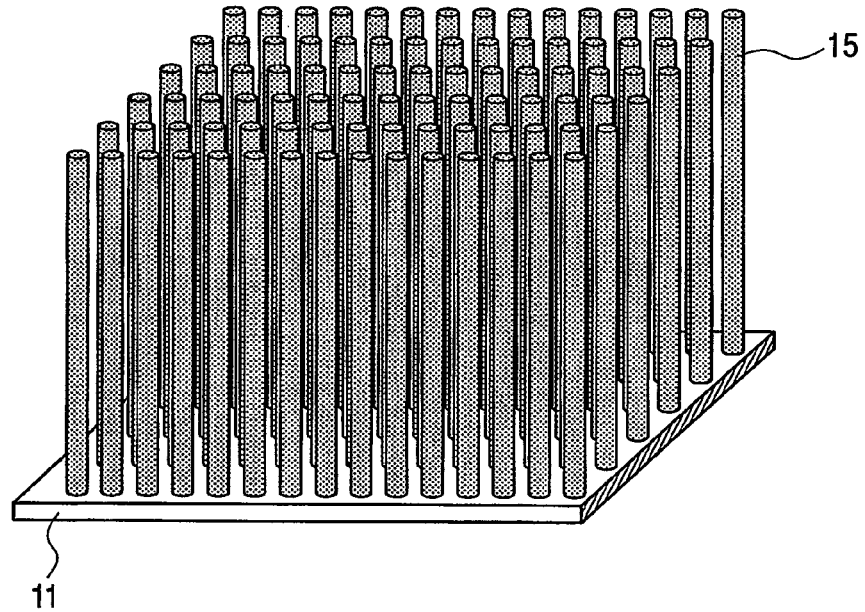
FIG. 1 is a schematic diagram showing an example of a form in which columnar members are not surrounded by another material in a columnar structured material produced on a substrate according to the present invention.
Figure 2:
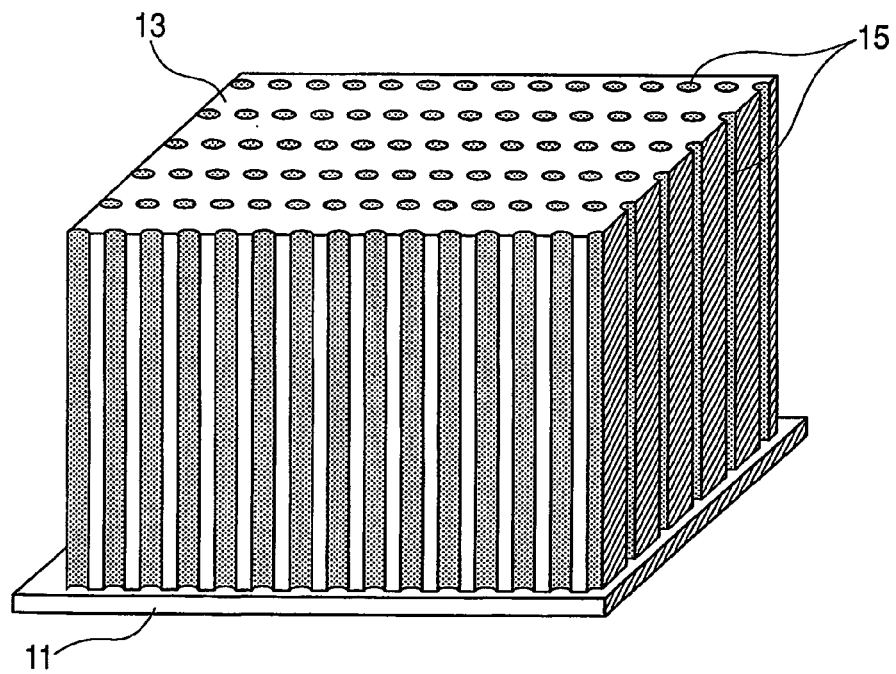
FIG. 2 is a schematic diagram showing an example of a form in which the columnar members are surrounded by another material in the columnar structured material produced on the substrate according to the present invention.
Figure 3A:
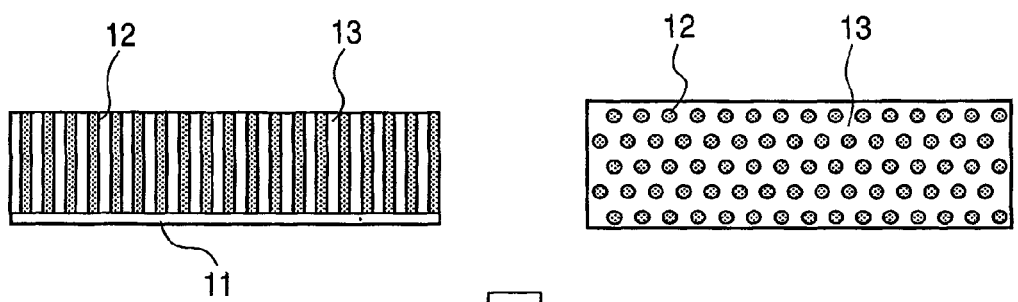
FIGS. 3A, 3B, 3C and 3D are schematic diagrams for explaining a production step of the columnar structured material according to the present invention.
Figure 3B:
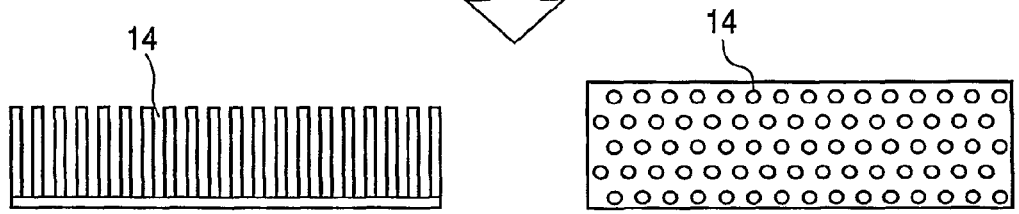
Figure 3C:
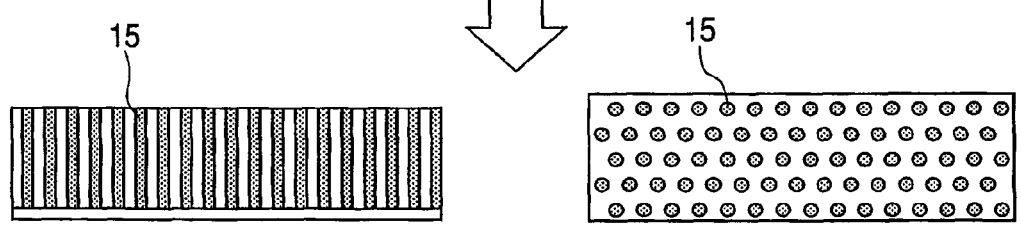
Figure 3D:

The columnar structured material of this embodiment has such a structure as schematically described in FIG. 1, for example. Columnar members 15 are formed on a substrate 11 so as to be perpendicular to the substrate to structure the columnar structured material. In this embodiment, the columnar structured material may be present in either a state where each of the columnar members 15 is not surrounded by another substance as shown in FIG. 1, or a state where each of the columnar members 15 is surrounded by a member 13 containing another substance as shown in FIG. 2.

The substrate 11 basically has no limits of its material and its thickness. Various materials such as glass, a metal, a ceramic, a semiconductor, or an organic material can be used as the substrate 11. The columnar structured material 15 formed on the substrate is formed of a material such as a metal or a semiconductor.

Hereinbelow, description will be made of a production method for the columnar structured material by using sectional views and plan views of FIGS. 3A to 3D. Note that steps A to D correspond to FIGS. 3A to 3D, respectively.

(Step A)

A target containing materials that form a eutectic system at an appropriate ratio is used to produce a thin film having a structure, in which a first component 12 of a columnar form are dispersed in the member (matrix member) 13 containing a second component, on the substrate 11 by sputtering. Here, the second component that forms a eutectic with the first component is selected. The target used for this case may not necessarily be a mixture of the two components, and may be such a target as to have a substance superposed by another substance, and may also be a structure obtained by bonding the two materials so as to have a desired area ratio.

For example, the film having the above-mentioned structure can be produced on the substrate by performing sputtering in a state where an appropriate amount of silicon wafer is superposed on an aluminum target.

Film formation is described by taking the sputtering as an example, but any film forming method that is capable of forming a similar structure can be applied to this embodiment.

(Step B)

The columnar substances are removed from the structured material produced in step A to form a porous thin film. Wet etching is preferably used for the selective removal for the columnar substances. For example, in the case where the crystalline aluminum columns are formed in the amorphous silicon member, the etching by use of phosphoric acid or sulfuric acid can be used to remove only aluminum and produce holes 14 without changing the form of silicon.

(Step C)

A desired material is introduced into the holes of the porous thin film produced in step B. In the case of using a substrate having a conductive surface, a metal or the like can easily be introduced by an electrodeposition process. The electrodeposition process or the like may also be used to form a substance to be a catalyst at a bottom of the hole and form the desired material by action of the catalyst. Alternatively, before step A, the catalyst at the bottom of the hole may be formed on a substrate surface by a method such as vapor deposition. Here, the object material forming the columnar member may not be a single substance, but a plurality of materials having different compositions may also be contained, for example, in one columnar member.

Before performing processes subsequent to step C, in order to perform the subsequent processes with ease, a step may be performed in which the porous thin film formed in step B is subjected to chemical treatment and properties of a porous material are changed. Specifically, the chemical treatment in this case refers to oxidation treatment or the like.

By performing step C, as shown in FIG. 2, the columnar structured material that is composed of the columnar members 15 formed of the object material and the member 13 is formed in the member that has surrounded the columnar substances in the original film.

(Step D)

This step is a step of removing the member (matrix member) 13 from the columnar structured material. This step is performed in order to obtain the columnar structured material of FIG. 1. In this step, only member components are selectively removed, and a structure is formed in which the columnar members 15 that are not surrounded by any substances are arranged on the substrate 11. A process such as, for example, etching can be applied as the method of selectively removing the member components. For example, in the case where the silicon is a first member material and changed into silicon oxide in step C, etching using dilute hydrofluoric acid can preferably be applied.

According to the above-mentioned steps, the columnar structured material shown in FIG. 1 or 2 can be produced.

Next, detailed description will be further made of the above-mentioned structured material in which given components are formed into a columnar form having a minute diameter and dispersed in the matrix member of other components.

First, description is made of an experiment regarding to the above-mentioned structured material.

Experimental Example

First Material Al, Second Material Si

An aluminum microwire will be shown, in which an aluminum structured material portion surrounded by silicon has a columnar structure, a diameter $2r$ of 3 nm, an interval $2R$ of 7 nm, and a length L of 200 nm.

First, description will be made of a production method for an aluminum microwire.

An aluminum-silicon mixture film containing 55 atomic % of silicon with respect to the total amount of aluminum and silicon is formed into a thickness of approximately 200 nm on a glass substrate by RF magnetron sputtering. Used as the target was a 4-inch aluminum target on which eight silicon chips 13 of 15 mm square were arranged. Sputtering was performed using the RF power supply under conditions of an Ar flow rate: 50 sccm, a discharge pressure: 0.7 Pa, and a starting power: 1 kW. Also, a temperature of the substrate was set to the room temperature.

Note that the aluminum target on which the eight silicon chips were arranged was used here as the target. However, the number of the silicon chips is not limited thereto. The number changes depending on the sputtering conditions, and may be any number as long as the composition of the aluminum-silicon mixture film is approximately 55 atomic %. Also, the target was not limited to the aluminum target on which the silicon chips are arranged, and may be a silicon target on which aluminum chips are arranged, or a target obtained by sintering powder of silicon and aluminum.

Next, the aluminum-silicon mixture film thus obtained was analyzed concerning the fractional amount (atomic %) of silicon with respect to the total amount of aluminum and silicon through an ICP (induction-coupled plasma emission spectrometry). As a result, it was found that the fractional amount of silicon was about 55 atomic % with respect to the total amount of aluminum and silicon. Note that for the convenience of the measurement here, an aluminum-silicon mixture film deposited onto a carbon substrate is used for a substrate.

The aluminum-silicon mixture film produced as described above was observed with an FE-SEM (field emission scanning electron microscope). The shape of the surface viewed from directly above the substrate was in such a condition that circular aluminum nanostructured materials surrounded by silicon were arranged two-dimensionally. The hole diameter of the aluminum nanostructured material part was 3 nm, and the average center-to-center interval was 7 nm. In addition, when the cross section thereof was observed with the FE-SEM, the height of the film was 200 nm, and the respective aluminum nanostructured material parts are independent of one another.

Further, when this sample was observed by an X-ray diffraction method, any peak of silicon exhibiting crystallinity could not be checked, and the silicon was amorphous.

Accordingly, the aluminum-silicon nanostructured material could be structured, which included the aluminum microwire surrounded by silicon and had an interval 2R of 7 nm, a diameter 2r of 3 nm, and a length L of 200 nm.

Comparative Example

Further, as a comparative sample A, the aluminum-silicon mixture film containing 15 atomic % of silicon with respect to the total amount of aluminum and silicon was formed on the glass substrate into a thickness of approximately 200 nm by sputtering. Used as the target was the 4-inch aluminum target on which two silicon chips 13 of 15 mm square were arranged. The sputtering was performed using the RF power supply under conditions of an Ar flow rate: 50 sccm, a discharge pressure: 0.7 Pa, and a starting power: 1 kW. Also, the temperature of the substrate was set to the room temperature.

The comparative sample A was observed with the FE-SEM (field emission scanning electron microscope). The shape of the surface viewed from right above the substrate was in such a condition that an aluminum portion did not have a circular form but had a rope form. That is, the microstructured material in which the columnar structured materials of aluminum were uniformly dispersed within a silicon region could not be obtained. Further, the size was far larger than 10 nm. Also, when the section was observed with the FE-SEM, the width of the aluminum portion exceeded 15 nm. Note that the aluminum-silicon mixture film thus obtained was subjected to an analysis of the fractional amount (atomic %) of silicon with respect to the total amount of aluminum and silicon through the ICP (induction-coupled plasma emission spectrometry). As a result, the fractional amount of silicon with respect to the total amount of aluminum and silicon was approximately 15 atomic %.

Further, as a comparative sample B, the aluminum-silicon mixture film containing 75 atomic % of silicon with respect to the total amount of aluminum and silicon was formed on the glass substrate into a thickness of approximately 200 nm by sputtering. Used as the target was the 4-inch aluminum target on which fourteen silicon chips 13 of 15 mm square were arranged. The sputtering was performed using the RF power supply under conditions of an Ar flow rate: 50 sccm, a discharge pressure: 0.7 Pa, and a starting power: 1 kW. Also, the temperature of the substrate was set to the room temperature.

The comparative sample B was observed with the FE-SEM (field emission scanning electron microscope). In the sample surface viewed from right above the substrate, the aluminum portion could not be observed. Also, even when the section was observed with the FE-SEM, the aluminum portion could not be observed clearly. Note that the aluminum-silicon mixture film thus obtained was subjected to an analysis of the fractional amount (atomic %) of silicon with respect to the total amount of aluminum and silicon through the ICP (induction-coupled plasma emission spectrometry) As a result, the fractional amount of silicon with respect to the total amount of aluminum and silicon was approximately 75 atomic %.

Further, samples were each prepared only by changing the condition of the number of the silicon chips compared to the case of producing the comparative sample A such that the proportions of silicon with respect to the total amount of the aluminum-silicon mixture were respectively 20 atomic %, 35 atomic %, 50 atomic %, 60 atomic %, and 70 atomic %. The following table shows the case where the microstructured material in which the columnar structured materials of aluminum were uniformly dispersed within a silicon region was obtained, which is represented by "Yes", and the case where the microstructured material was not obtained, which is represented by "No".

TABLE 1

| Proportion of Silicon (atomic %) | Microstructured Material |
|---|---|
| 15 (Comparative Example A) | No |
| 20 | Yes |
| 25 | Yes |
| 35 | Yes |
| 50 | Yes |
| 55 | Yes |
| 60 | Yes |
| 65 | Yes |
| 70 | Yes |
| 75 (Comparative Example B) | No |

As shown in the table 1, the content of silicon with respect to the total amount of aluminum and silicon is adjusted to a range from 20 atomic % to 70 atomic %, thereby making it possible to control the hole diameter of the produced aluminum nanostructured material and to produce the aluminum microwire superior in linearity. Note that for observation of the structure, the TEM (transmission electron microscope) or the like may be utilized as well as SEM. Note that the above-mentioned content was the same even when using germanium or the mixture of silicon and germanium instead of silicon described above.

Further, as a comparative sample C, the aluminum-silicon mixture film containing 55 atomic % of silicon with respect to the total amount of aluminum and silicon was formed on the glass substrate into a thickness of approximately 200 nm by sputtering. Used as the target was the 4-inch aluminum target on which eight silicon chips 13 of 15 mm square were arranged. The sputtering was performed using the RF power supply under conditions of an Ar flow rate: 50 sccm, a discharge pressure: 0.7 Pa, and a starting power: 1 kW. Also, the temperature of the substrate was set to 250° C.

The comparative sample C was observed with the FE-SEM (field emission scanning electron microscope). In the sample surface viewed from right above the substrate, the boundary between aluminum and silicon could not be observed clearly.

That is, the aluminum nanostructured material could not be verified. In other words, under the substrate temperature being too high, the state becomes more stable, so that it is assumed that the film growth for forming the aluminum nanostructured material cannot be attained.

Note that in order to obtain the structured material in which the columnar members are dispersed, it is also preferable that the composition of the target is set as Al:Si=55:45 or the like.

As described above, the above-mentioned structured material is structured by containing the first material (component) and the second material (component), and has the columnar member structured by containing the first material surrounded by a region formed by containing the second material. In the structured material, it is desirable that the proportion of the contained second material to the total amount of the first material and the second material is in the range from 20 atomic % to 70 atomic %.

The above proportion is obtained as a proportion of the second material to the total amount of the first material and the second material that compose the structured material, and is in a range preferably from 25 atomic % to 65 atomic %, more preferably from 30 atomic % to 60 atomic %

Note that any composition can be applied as long as the columnar form is substantially attained. For example, the second material may be contained as a component of the columnar member, or the first material may be contained in the above-mentioned region. Also, a small amount of oxygen, argon, nitrogen, hydrogen, or the like may be contained in the columnar member or the region around the columnar member.

The above proportion is obtained by, for example, a quantitative analysis using the induction-coupled plasma emission spectrometry.

Examples of the first material include Al and Au. Examples of the second material include Si, Ge, $Si_xGe_{1-x}$, and C. In particular, the second material is desirably a material that can be amorphous. The first material and the second material are preferably materials having a eutectic point (so-called eutectic materials) in the phase equilibrium diagram of both component materials. In particular, the eutectic point is preferably 300° C. or higher, more preferably, 400° C. or higher. Note that preferable combinations of the first material and the second material include a case in which Al is used as the first material and Si is used as the second material, a case in which Al is used as the first material and Ge is used as the second material, and a case in which Al is used as the first material and $Si_xGe_{1-x}$ (0<x<1) is used as the second material.

The region surrounding the columnar member is desirably amorphous. Also, the planar shape of the columnar member is desirably a circular shape or an elliptical shape.

Diameters (a diameter in the case where the planar shape is the circular shape) of the columnar member can be controlled depending on the composition (that is, proportion of the second material) of the structured material. The average diameter is in a range from 0.5 nm to 50 nm, preferably from 0.5 nm to 20 nm, more preferably from 0.5 nm to 15 nm. The diameter here is denoted by $2r$ in FIG. 5. Note that in the case of the elliptical shape, its largest outer diameter portion may be in the above range. The average diameter here is a value obtained, for example, by deriving a columnar portion observed in an actual SEM photograph (in a range of approximately 100 nm×70 nm) directly from the photograph or an image processed by a computer. Note that a lower limit of the average diameter depends on which device employs the structured material or which process is performed, and the practical lower limit is in a range of 1 nm or more or of several nm or more. Also, a center-to-center distance $2R$ (FIG. 5) between a plurality of columnar members is in a range from 2 nm to 30 nm, preferably from 5 nm to 20 nm, more preferably from 5 nm to 15 nm. Naturally, a lower limit of the center-to-center distance $2R$ needs to be at least as large as an interval enough to keep the columnar members from contacting each other.

The structured material is preferably a structured material having a film form. In this case, the columnar members are dispersed in a matrix formed by containing the second material so as to be substantially perpendicular to an in-plane direction of the film surface. The structured material may be provided onto the substrate. The film thickness of the film-formed structured material is not particularly limited, but can be applied in a range from 1 nm to 100 μm. With consideration given to a processing time or the like, the more realistic film thickness is approximately 1 nm to 1 μm. In particular, the columnar members are preferably maintained even with the film thickness of 300 nm or more.

The substrate is not particularly limited, but examples of the substrate that can be used include an insulating substrate of quartz glass or the like, a semiconductor substrate of silicon, gallium arsenide, phosphorus indium, indium phosphorus, or the like, and a metal substrate of aluminum or the like, and also include a flexible substrate (of, for example, a polyimide resin, or the like) if the structured material can be formed on a substrate serving as a supporting member.

The structured material can be produced using a method of forming a film in a non-equilibrium state. As the film forming method, sputtering is preferable, but a film forming method for forming a substance in an arbitrary non-equilibrium state such as resistance heating evaporation, electron-beam evaporation (EB evaporation), or ion plating can also be applied. In the case of performing sputtering, magnetron sputtering, RF sputtering, ECR sputtering, DC sputtering, or the like can be used. At the time of performing sputtering, a film is formed by setting the inside pressure of a reaction apparatus in an argon gas atmosphere to approximately 0.2 to 1 Pa. At the time of sputtering, the first material and the second material may be separately prepared, but a target material obtained by previously baking the first material and the second material at a desired ratio may alternatively be used.

The structured material formed on the substrate is formed at a substrate temperature in a range from 20° C. to 300° C., preferably 20° C. to 200° C.

By removing (etching or dry etching) the columnar member from the structured material, a porous material having a plurality of columnar holes is formed. Any kind of etching can be used as long as the columnar member can be selectively removed. Examples of an etchant preferably include acid such as phosphoric acid, sulfuric acid, hydrochloric acid, or nitric acid. The holes of the porous material formed by the removing process are preferably independent of one another without being connected to one another. By filling microholes of the porous material with various materials, elements and devices having various functions can be provided. Note that the filling of the functional material may be performed after subjecting the porous material obtained by removing the columnar members to chemical treatment or heat treatment (for example, oxidation treatment, nitriding treatment, or the like). Naturally, in the case of oxidation or the like, the structured material having the microholes may be oxidized completely, or walls of the microholes can be mainly oxidized.

Description has been made of the structured material used for the production of the columnar structured material, but naturally, the structured material can also be applied to an electrode having a columnar structured material described below.

Embodiment Regarding Electrode Having Columnar Structured Material

In the case where a film of a plurality of substances each included in a eutectic system is formed on a substrate by the method such as, for example, sputtering, the respective components independently are present in the film without being mixed. In the case where the film forming conditions and compositions of the substances are optimized for a specific material system, given components are formed into a columnar form having a minute diameter to form the structure in which the given components are dispersed within the matrix member of other components. The structure is a novel structured material discovered by the inventors of the present invention, in which the columnar substances are present so as to penetrate from the substrate interface to the film surface. The diameter of each column of the formed columnar substances is in the range from 0.5 nm to 15 nm. Also, the interval between the columnar substances is in the range from 5 nm to 20 nm.

A specific example is given for explanation. In the case of producing the mixture film of aluminum and silicon on the substrate by sputtering, if the conditions are optimized, the crystalline aluminum columns are formed in the fine matrix member of amorphous silicon. It is indicated by the observation using the scanning electron microscope that aluminum is present in the film as the single columns extending from the substrate interface to the film surface. The similar structure is found to be formed using the mixture film of aluminum and germanium produced by sputtering. The film thickness can be controlled by adjusting the sputtering time. Even if the film thickness is increased, the columnar structure does not end in its middle as long as the sputtering is not interrupted.

According to this embodiment, the columnar structured material of a desired composition can be produced by removing the columnar substances from the film containing the above columnar substances, introducing a desired material into resultant holes, and electrically connecting at least a part of the material to a conductive material.

Figure 6:
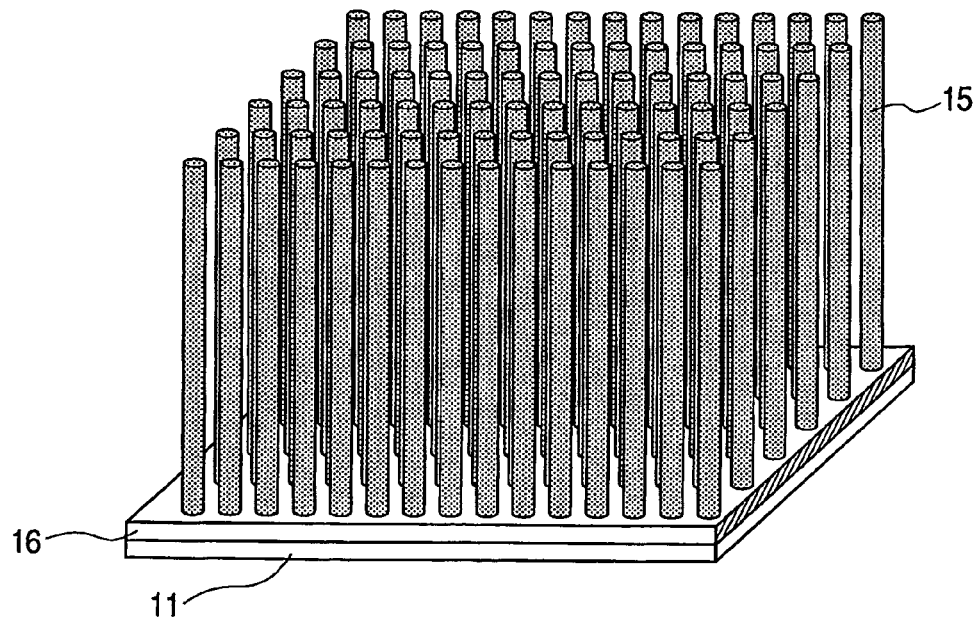
FIG. 6 is a schematic diagram showing an electrode having the columnar structured material produced on a substrate according to the present invention.
Figure 7A:
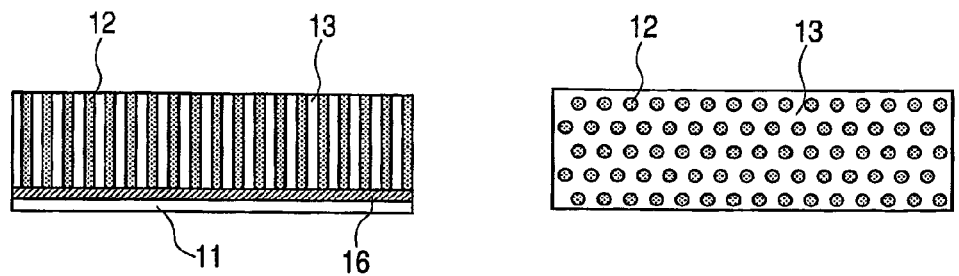
FIGS. 7A, 7B, 7C and 7D are schematic diagrams for explaining a production step of the electrode having the columnar structured material according to the present invention.
Figure 7B:
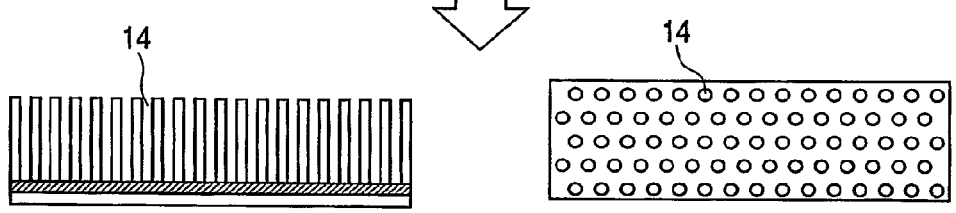
Figure 7C:
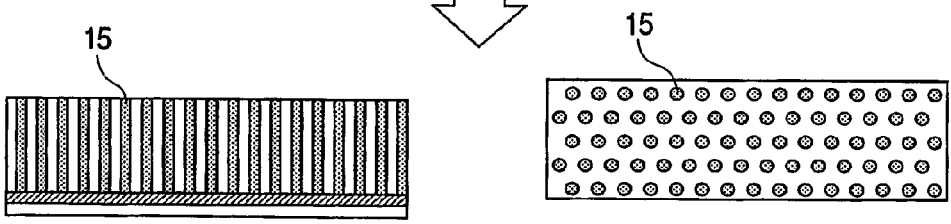
Figure 7D:

An example of an electrode having the columnar structured material of this embodiment is schematically shown in FIG. 6. In its structure, a conductive material (conductor) 16 is on a substrate 11, and the columnar members 15 that are perpendicular to the conductive material 16 and have substantially the same diameter are connected onto the conductive material 16. In this embodiment, each of the columnar members 15 is not surrounded by another substance as shown in FIG. 6.

The substrate 11 is basically not limited regarding its material and its thickness. Various materials such as glass, a metal, a ceramic, a semiconductor, or an organic material can be used as the substrate 11. The columnar members 15 and the conductive material 16 that are formed on the substrate 11 are formed of a material such as a metal or a semiconductor. In this case, the columnar members and the conductive material may formed of the same material, and the conductive material and the substrate may also be formed of the same material, which can easily be switched depending on the application purpose or production method.

Hereinbelow, description will be made of a production method for the electrode having the columnar structured material by using sectional views and plan views of FIGS. 7A to 7D. Note that steps A to D correspond to FIGS. 7A to 7D, respectively.

(Step A)

The target containing materials forming a eutectic system at an appropriate ratio is used to produce the thin film having a structure, in which the first component 12 having a columnar form are dispersed in the member 13 containing the second component, on the substrate 11 on which the conductive material 16 is superposed by sputtering. Here, the second component that forms a eutectic with the first component is selected. The target used for this case may not necessarily be the mixture of the two components but may be such a target as to have a substance superposed by another substance, and may also be a structure obtained by bonding the two substances so as to have a desired area ratio.

For example, the film having the above-mentioned structure can be produced on the conductive material by performing sputtering in the state where an appropriate amount of silicon wafer is superposed on an aluminum target.

Film formation is described by taking the sputtering as an example, but any film forming method that is capable of forming a similar structure can be applied to this embodiment.

(Step B)

The columnar substances are removed from the structured material produced in step A to form the porous thin film. Wet etching is preferably used for the selective removal of the columnar substances. For example, in the case where the crystalline aluminum columns are formed in the amorphous silicon member, the etching by use of phosphoric acid or sulfuric acid can be used to remove only aluminum to produce the holes 14 without changing the form of silicon.

(Step C)

A desired material is introduced into the holes of the porous thin film produced in step B. In the case of using a substrate having a conductive material, a metal or the like can easily be introduced by the electrodeposition process. The electrodeposition process may also be used to form the substance to be a catalyst at the bottom of the hole and form the desired material by the action of the catalyst. Alternatively, before step A, the catalyst at the bottom of the hole may be formed on the substrate surface by the method such as vapor deposition. Here, the desired material forming the columnar structured material may not be a single substance, but a plurality of materials having different compositions may also be contained, for example, in one columnar structured material.

Before performing processes subsequent to step C, in order to perform the subsequent processes with ease, a step may be performed in which the porous thin film formed in step B is subjected to chemical treatment and the properties of a porous material are changed. Specifically, the chemical treatment in this case refers to oxidation treatment or the like.

By performing step C, the columnar structured material that is composed of the columnar members 15 formed of the desired material and the member 13 is formed in the member that has surrounded the columnar substances in the initial film.

(Step D)

This step is a step of removing the member (matrix member) 13 from the columnar structured material. In this step, only the member components are selectively removed, and a structure is formed in which the columnar members 15 that are not surrounded by any substances are arranged on the substrate. The process such as, for example, etching can be applied as the method of selectively removing the member components. For example, in the case where the silicon is the initial member material and subsequently changed into silicon oxide in step C, etching using dilute hydrofluoric acid can preferably be applied.

Here, in addition to the method using the conductive material that is previously provided onto the substrate as shown in FIG. 8A, it is also possible to produce a conductive material that is provided to the substrate from the opposite side as shown in FIG. 8B. The production method thereof can be changed based on the application purpose.

With the above-mentioned steps, the electrode having the columnar structured material shown in FIG. 6 can be produced.

In order to electrochemically use this electrode having the columnar structured material, an electrode area needs to be set to a desired value. For this purpose, the electrode may be processed into a desired size, or the region outside a region involved with the measurement may be covered with an insulator. As the latter case of forming the insulator, a technique such as vapor deposition is preferably used, but other techniques including a method of completely wrapping the region with a resin such as an adhesive can also preferably be used.

Examples

Hereinafter, examples of the present invention will be described with reference to the drawings.

Examples Regarding Columnar Structured Material

Example 1

This example relates to an example in which aluminum and silicon are used as materials which form a eutectic, gold columnar microstructured materials are formed through electrodeposition in microholes of porous oxidized silicon that is obtained in such a manner that aluminum columns in a film are removed to obtain a porous silicon film, which is thereafter further oxidized, and then oxidized silicon in the vicinity is removed.

Figure 4:
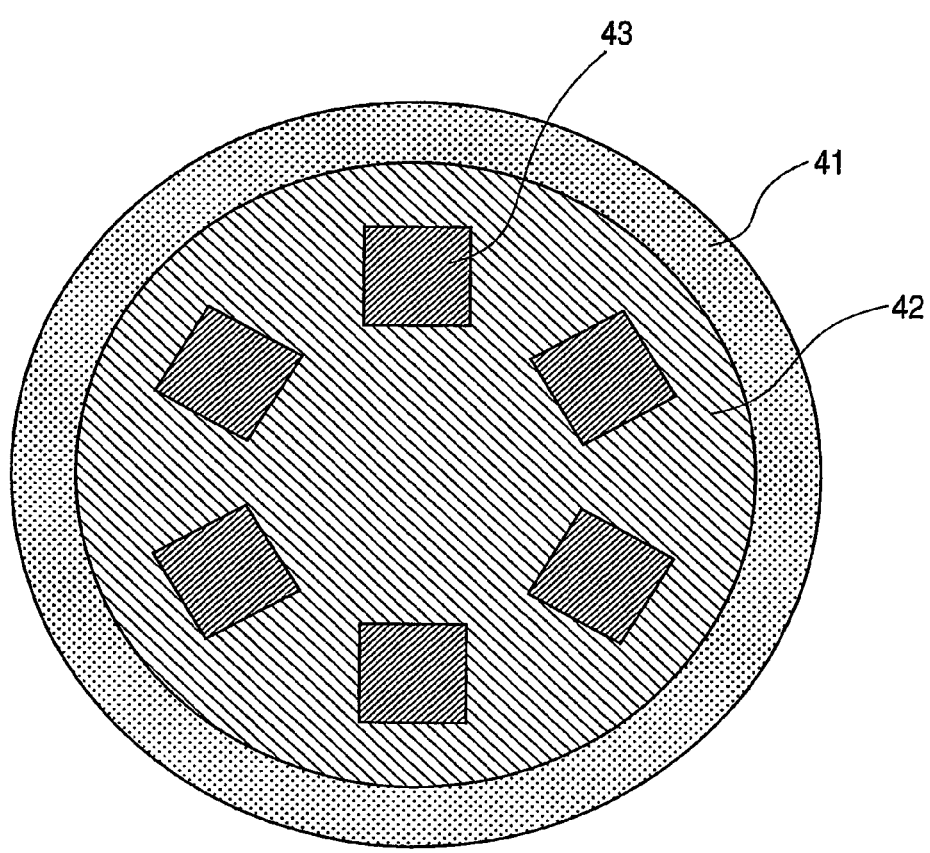
FIG. 4 is a schematic diagram of a sputtering target used in an example of the present invention.

Through RF magnetron sputtering, an aluminum-silicon mixture film was formed into a thickness of 200 nm on a silicon substrate having 20 nm of tungsten deposited thereon. FIG. 4 schematically shows a target used. As shown in the drawing, the target is composed of six silicon chips 43 of 15 mm square arranged on 4 inches of an aluminum target 42 on a backing plate. The sputtering was performed using the RF power supply under conditions of an Ar flow rate: 50 sccm, a discharge pressure: 0.7 Pa, and a starting power: 300 W. In addition, the substrate temperature was set to the room temperature.

Here, as the target, one having six silicon chips arranged on an aluminum target was used. However, the number of the silicon chips is not limited thereto because it varies according to the sputtering conditions, and any number may be used as long as a desired structure can be formed with aluminum columns being dispersed in silicon, as described below. In addition, the target is not limited to one having silicon chips arranged on an aluminum target, and it may be one having aluminum chips arranged on a silicon target, or a target obtained by baking silicon and aluminum powders may be used.

Further, the RF sputtering was used as a sputtering method here. However, the sputtering method is not limited thereto, and may be an ECR sputtering method, a DC sputtering method, or an ion beam sputtering method. Further, the sputtering conditions depend on an apparatus and are not limited thereto. In addition, even among vapor deposition methods other than the sputtering method, any methods with which a desired structure can be formed may be applied to the present invention.

Next, the aluminum-silicon mixture film thus obtained was analyzed concerning the fractional amount (atomic %) of silicon with respect to the total amount of aluminum and silicon through ICP (induction-coupled plasma emission spectrometry). As a result, it was found that the fractional amount of silicon was about 37 atomic % with respect to the total amount of aluminum and silicon.

Figure 5:
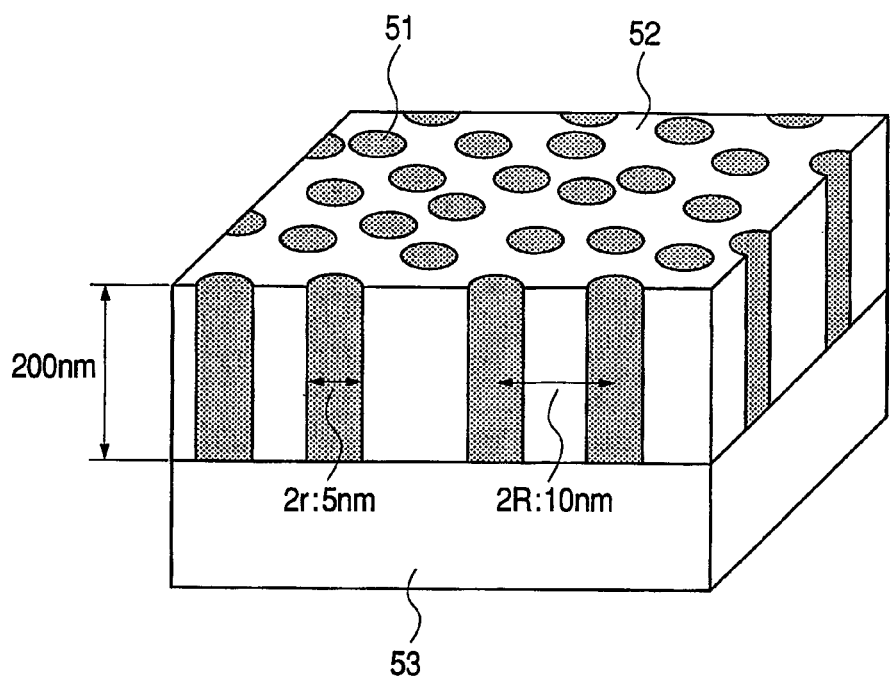
FIG. 5 is a schematic diagram showing a structure of an aluminum-silicon mixture film produced in the example.

The aluminum-silicon mixture film produced as described above was observed with a field emission scanning electron microscope (FE-SEM). As shown in FIG. 5, the shape of the surface obliquely viewed from directly above the substrate was in such a condition that substantially circular aluminum microcolumns surrounded by silicon 52 were arranged two-dimensionally. The average hole diameter of the aluminum column parts, which was found through image processing was 5 nm, and the average center-to-center interval was 10 nm. In addition, when the cross section thereof was observed with the FE-SEM, the height of the film was 200 nm, and the respective aluminum column parts were independent of each other.

In addition, when this thin film sample was analyzed through an X-ray diffraction method, any diffraction line of silicon was not verified, and it was found that silicon was amorphous. On the other hand, a plurality of diffraction lines of aluminum were verified, and it was therefore found that aluminum was polycrystalline.

Based on the above, production of the aluminum-silicon structured material thin film was verified, which contained crystalline aluminum columns whose vicinities were surrounded by amorphous silicon and which had an interval 2R of 10 nm, a diameter 2r of 5 nm, and a height L of 200 nm.

This aluminum-silicon structured material thin film was immersed in 98% sulfuric acid for 24 hours, and etching was selectively performed for the aluminum columnar structure parts to form microholes. As a result of the observation with the FE-SEM for the film after the etching, it was verified that only the aluminum columns 51 shown in FIG. 5 were removed, and the film became porous. It was found that the shape of the silicon part was not substantially changed as compared with its state before the aluminum removal. In this case as well, when the cross section thereof was observed with the FE-SEM, it became apparent that aluminum was completely removed up to the substrate interface. By following the above steps, the porous silicon film having on the substrate through holes perpendicular to the substrate could be produced.

Finally, the produced porous silicon film was heated in an oxygen atmosphere. Here, the heating was performed at 800° C. for 2 hours while oxygen was allowed to flow at 50 sccm under an atmospheric pressure. As a result, a porous oxidized silicon thin film was formed. The formation of oxidized silicon was verified with extended electron energy loss spectroscopy (EELS). As a result of the observation with the FE-SEM for the porous film after the oxidation processing, little change was recognized in the microhole diameter.

Next, gold columnar structured materials were produced through electrodeposition (electroplating) in the microholes of the porous film produced as described above. The porous oxidized silicon thin film produced in the above steps was put in a commercially available electroplating solution (electroplating solution for gold produced by Kojundo Chemical Laboratory Co., Ltd.; product code: K-24E), and the electrodeposition was performed at a current density of 0.5 A/dm$^2$ in an acid bath kept at 40° C. (pH=4.5).

The film after being subjected to the gold electrodeposition was rinsed with pure water, and thereafter the surface and the cross section thereof were observed with the FE-SEM. As a result, it was verified that gold is introduced into the microholes uniformly, and a columnar structure was formed.

This film was further immersed in 2% hydrofluoric acid to remove oxidized silicon present in the vicinity of gold. The completion of the oxidized silicon etching removal can be verified at the time when the surface changes to become hydrophobic after the fluoride processing is completed. As a result of the observation with the FE-SEM for the silicon substrate after the oxidized silicon removal, it was verified that the gold columnar microstructured materials were formed on the surface at a high density.

Example 2

This example relates to an example in which aluminum and germanium are used as materials which form a eutectic, and microholes of a porous germanium that is obtained by removing aluminum columns in a film is filled with nickel through electrodeposition followed by electroless deposition.

Through the RF magnetron sputtering, an aluminum-germanium mixture film was formed into a thickness of 200 nm on a silicon substrate having 20 nm of tungsten deposited thereon. A target used has the same structure as that used in Example 1, which is shown in FIG. 4, and instead of the silicon chips of Example 1, germanium chips are arranged thereon. In this example, four germanium chips were arranged on an aluminum target. The sputtering was performed using the RF power supply under conditions of an Ar flow rate: 50 sccm, a discharge pressure: 0.7 Pa, and a starting power: 1 kW. In addition, the substrate temperature was set to the room temperature.

Here, as the target, one having four germanium chips arranged on an aluminum target was used. However, the number of the germanium chips is not limited thereto because it varies according to the sputtering conditions, and any number may be used as long as a desired structure can be formed with aluminum columns being dispersed in germanium, as described below. In addition, the target is not limited to one having germanium chips arranged on an aluminum target, and it may be one having aluminum chips arranged on a germanium target, or a target obtained by baking germanium and aluminum powders may be used.

Further, the RF sputtering was used as a sputtering method here. However, the sputtering method is not limited thereto, and may be the ECR sputtering method, the DC sputtering method, or the ion beam sputtering method. Further, the sputtering conditions depend on an apparatus and are not limited thereto. In addition, even among vapor deposition methods other than the sputtering method, any methods with which a desired structure can be formed may be applied to the present invention.

Next, the aluminum-germanium mixture film thus obtained was analyzed concerning the fractional amount (atomic %) of germanium with respect to the total amount of aluminum and germanium through the ICP (induction-coupled plasma emission spectrometry). As a result, it was found that the fractional amount of germanium was about 37 atomic % with respect to the total amount of aluminum and germanium.

The aluminum-germanium mixture film produced as described above was observed with the field emission scanning electron microscope (FE-SEM). Similarly to the shape shown in FIG. 5 in Example 1, the shape of the surface obliquely viewed from directly above the substrate was in such a condition that substantially circular aluminum microcolumns surrounded by germanium members were arranged two-dimensionally. The average hole diameter $2r$ found by performing image processing on the aluminum column parts was 10 nm, and the average center-to-center interval $2R$ was 15 nm. In addition, when the cross section thereof was observed with the FE-SEM, the height of the film was 200 nm, and the respective aluminum column parts were independent of each other.

In addition, when this thin film sample was analyzed through the X-ray diffraction method, any diffraction line of germanium was not verified, and it was found that germanium was amorphous. On the other hand, a plurality of diffraction lines of aluminum were verified, and it was therefore found that aluminum was polycrystalline.

Based on the above, production of the aluminum-germanium structured material thin film was verified, which contained crystalline aluminum columns whose vicinities were surrounded by amorphous germanium and which had the interval $2R$ of 15 nm, the diameter $2r$ of 10 nm, and a height L of 200 nm.

This aluminum-germanium structured material thin film was immersed in 98% sulfuric acid for 24 hours, and etching was selectively performed for the aluminum columnar structure parts to form microholes. As a result of the observation with the FE-SEM for the film after the etching, it was verified that only the aluminum columns were removed, and the film became porous. It was found that the shape of the germanium part was not substantially changed as compared with its state before the aluminum removal. In this case as well, when the cross section thereof was observed with the FE-SEM, it became apparent that aluminum was completely removed up to the substrate interface. By following the above steps, the porous germanium film having on the substrate the through holes perpendicular to the substrate could be produced.

Next, nickel columnar structured materials were produced through electrodeposition followed by electroless deposition in the microholes of the porous film produced in the above-mentioned manner. First, an alternating current (35 V, 50 Hz) electrolysis was performed in an electrolytic solution composed of 0.14 M $NiSO_4$ and 0.5 M $H_3BO_3$ to deposit nickel at the bottom of the microholes. After that, an Ni electroless deposition bath composed of 0.1 M $NiSO_4$, 0.24 M $NaPH_2O_2$, and 0.1 M $Na_4P_2O_7$ was used to form nickel deposition layers over the entirety of the microholes. In this process, it is conceivable that nickel previously deposited at the bottom of the microholes through the alternating current electrolysis functions as a catalyst, and rapid filling of nickel into the microholes occurs.

As a result of the observation with the FE-SEM for the surface and the cross section of the thin film after the nickel filling, it was verified that the microholes were uniformly filled with nickel.

As described above, this example shows that the nickel columnar structured materials can be produced in the amorphous germanium film at a high density.

Example 3

This example relates to an example in which aluminum and silicon are used as materials which form a eutectic, aluminum columns in a film are removed to obtain a porous silicon film, which is thereafter subjected to oxidation processing to obtain a porous oxidized silicon film, gold deposition is formed at the bottom of microholes through electrodeposition, and crystalline silicon columnar structured materials are produced through a catalytic reaction using gold as a catalyst.

First, an aluminum-silicon mixture film, which is the same as that produced in Example 1, was formed on a silicon substrate having 20 nm of tungsten deposited thereon under the same conditions as those of Example 1. Etching processing with 98% sulfuric acid was performed on this film under the same conditions as those of Example 1 to selectively remove aluminum. Further, the porous oxidized silicon film thus obtained was thermally oxidized under the same conditions as those of Example 1 to obtain the porous oxidized silicon film. By use of evaluation means similar to those of Example 1 such as the observation with the FE-SEM, it was verified that the porous oxidized silicon film similar to that of Example 1 was formed.

Gold was introduced into the bottom of the microholes through electrodeposition. The electrodeposition was performed at a current density of 0.3 A/dm$^2$ for 5 seconds by using the same plating solution as that of Example 1. The substrate after the electrodeposition was thoroughly rinsed with pure water and then dried.

Subsequently, the substrate having thereon this oxidized silicon film that had gold held at the bottom of the microholes was retained in a silica tube, and after reducing the pressure to 13.3 Pa or lower, the substrate was heated to 440° C. in an Ar gas stream. Subsequently, a mixture gas of helium gas mixed with 10% silane gas was supplied for 60 seconds at a flow rate of 50 sccm. After stop of the silane gas supply, the sample substrate was taken out when the temperature decreased to a room temperature after slow cooling.

The cross section of the sample thin film after performing the above steps was evaluated with the FE-SEM. As a result, it became apparent that the silicon microstructured materials were formed in the microholes. It was verified through an X-ray diffraction analysis or the like that this silicon was highly crystallized. In this case, it is conceivable that gold at the bottom of the microholes functions as a catalyst, and crystalline silicon is formed owing to a Vapor-Liquid-Solid (VLS) mechanism. By following the above steps, the crystalline silicon columnar structured materials could be formed in porous oxidized silicon.

Removal of oxidized silicon was performed with a 2% hydrofluoric acid solution similarly to Example 1 on the substrate in which the silicon formation in the microholes was performed. As a result of the observation with the FE-SEM for the substrate after the removal of oxidized silicon, aggregations of the silicon columnar structured materials were observed on the substrate at a high density, and thus the formation of the silicon columnar structured materials on the substrate through the above steps was verified.

Examples Regarding Electrode Having Columnar Structured Material

Example 4

This example relates to an example in which a silicon substrate having platinum thereon is used as a substrate, aluminum and silicon are used as materials which form a eutectic, platinum columnar microstructured materials are formed through electrodeposition in microholes of porous oxidized silicon that is obtained in such a manner that aluminum columns in a film are removed to obtain a porous silicon film, which is thereafter further oxidized, and then oxidized silicon in the vicinity is removed to obtain an electrode having columnar structured materials.

Through the RF magnetron sputtering, an aluminum-silicon mixture film was formed into a thickness of 200 nm on a silicon substrate having 50 nm of platinum deposited thereon. FIG. 4 schematically shows a target used. As shown in the drawing, the target is composed of the six silicon chips 43 of 15 mm square arranged on 4 inches of the aluminum target 42 on a backing plate. The sputtering was performed using the RF power supply under conditions of the Ar flow rate: 50 sccm, the discharge pressure: 0.7 Pa, and the starting power: 300 W. In addition, the substrate temperature was set to the room temperature.

Here, as the target, one having six silicon chips arranged on an aluminum target was used. However, the number of the silicon chips is not limited thereto because it varies according to the sputtering conditions, and any number may be used as long as a desired structure can be formed with aluminum columns being dispersed in silicon, as described below. In addition, the target is not limited to one having silicon chips arranged on an aluminum target, and it may be one having aluminum chips arranged on a silicon target, or a target obtained by baking silicon and aluminum powders may be used.

Further, the RF sputtering was used as a sputtering method here. However, the sputtering method is not limited thereto, and may be the ECR sputtering method, the DC sputtering method, or the ion beam sputtering method. Further, the sputtering conditions depend on an apparatus and are not limited thereto. In addition, even among vapor deposition methods other than the sputtering method, any methods with which a desired structure can be formed may be applied to the present invention.

Next, the aluminum-silicon mixture film thus obtained was analyzed concerning the fractional amount (atomic %) of silicon with respect to the total amount of aluminum and silicon through the ICP (induction-coupled plasma emission spectrometry). As a result, it was found that the fractional amount of silicon was about 37 atomic % with respect to the total amount of aluminum and silicon.

The aluminum-silicon mixture film produced as described above was observed with the field emission scanning electron microscope (FE-SEM). As shown in FIG. 5, the shape of the surface obliquely viewed from directly above the substrate was in such a condition that substantially circular aluminum microcolumns surrounded by silicon 52 were arranged two-dimensionally. The average hole diameter of the aluminum column parts, which was found through image processing was 5 nm, and the average center-to-center interval was 10 nm. In addition, when the cross section thereof was observed with the FE-SEM, the height of the film was 200 nm, and the respective aluminum column parts were independent of each other.

In addition, when this thin film sample was analyzed through the X-ray diffraction method, any diffraction line of silicon was not verified, and it was found that silicon was amorphous. On the other hand, a plurality of diffraction lines of aluminum were verified, and it was therefore found that aluminum was polycrystalline.

Based on the above, production of the aluminum-silicon structured material thin film was verified, which contained crystalline aluminum columns whose vicinities were surrounded by amorphous silicon and which had an interval 2R of 10 nm, a diameter 2r of 5 nm, and a height L of 200 nm.

This aluminum-silicon structured material thin film was immersed in 98% sulfuric acid for 24 hours, and etching was selectively performed for the aluminum columnar structure parts to form microholes. As a result of the observation with the FE-SEM for the film after the etching, it was verified that only the aluminum columns 51 shown in FIG. 5 were removed, and the film became porous. It was found that the shape of the silicon part was not substantially changed as compared with its state before the aluminum removal. In this case as well, when the cross section thereof was observed with the FE-SEM, it became apparent that aluminum was completely removed up to the substrate interface. By following the above steps, the porous silicon film having on the substrate the through holes perpendicular to the substrate could be produced.

The porous silicon film produced in this way was heated in an oxygen atmosphere. Here, the heating was performed at 800° C. for 2 hours while oxygen was allowed to flow at 50 sccm under an atmospheric pressure. As a result, a porous oxidized silicon thin film was formed. The formation of oxidized silicon was verified with the extended electron energy loss spectroscopy (EELS). As a result of the observation of with the FE-SEM for the porous film after the oxidation processing, little change was recognized in the microhole diameter.

Next, platinum columnar structured materials were produced through the electrodeposition (electroplating) in the microholes of the porous film produced as described above. The porous oxidized silicon thin film produced in the above steps was put in a commercially available electroplating solution (electroplating solution for gold produced by Kojundo Chemical Laboratory Co., Ltd.; product code: PT-100E), and the electrodeposition was performed at a current density of 1.5 A/dm$^2$ in an acid bath kept at 70° C. (pH=0.1).

The film after the platinum electrodeposition was rinsed with pure water, and thereafter the surface and the cross section thereof were observed with the FE-SEM. As a result, it was verified that platinum was introduced into the microholes uniformly, and a columnar structure was formed.

This film was further immersed in 2% hydrofluoric acid to remove oxidized silicon present in the vicinity of platinum. As a result of the observation with the FE-SEM for the silicon substrate after the oxidized silicon removal, it was verified that the platinum columnar microstructured materials were formed on the surface at a high density.

Next, description will be made of a production procedure as a processing method of using the produced electrode as an acting electrode in an electrolytic solution while referring to FIGS. 9A to 9C, and description will be made of a measurement method with reference to FIG. 10.

Figure 9A:
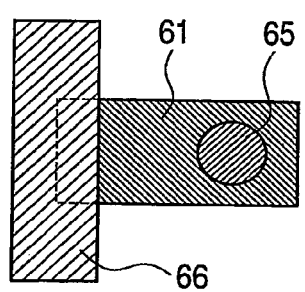
FIGS. 9A, 9B and 9C are schematic diagrams for explaining a production step for using the electrode having the columnar structured material as a function electrode according to the example of the present invention.
Figure 10:
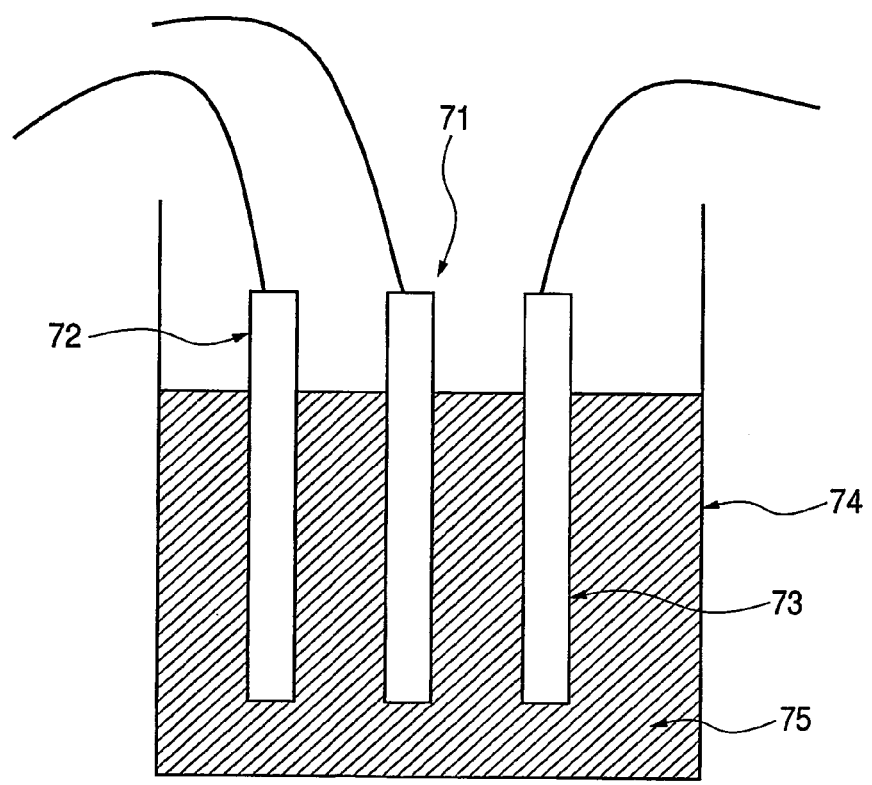
FIG. 10 is a schematic diagram for explaining an example of performing an electrochemical measuring method using the columnar structured material of the present invention.

As shown in FIG. 9A, in order to use the produced electrode having the columnar structured materials as an acting electrode, first, an area other than a measurement area was covered with an insulator. SiO$_2$ is used for an insulating film, and a sputtering method was employed as the covering method. An Ni mask 65 with Φ6 mm was set on the electrode having the columnar structured materials such that the measurement area had Φ6 mm, which is the same size as a commercially available platinum disk electrode used for comparison (manufactured by BAS Inc.; an electrode diameter: Φ6 mm; model No. 11-2013), and further an Ni mask 66 was set on a part of the area other than the above area to secure conduction of the surface. With these masks applied thereon, sputtering of SiO$_2$ with 300 nm was then performed. By following the above steps, the electrode was produced including a Φ6 mm effective area and being covered with SiO$_2$ in the area other than the lead wire connection part.

Figure 9B:
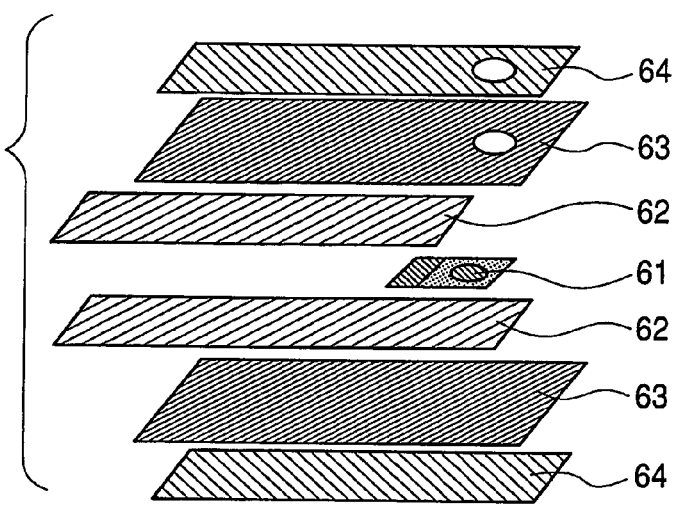

Next, as shown in FIG. 9B, a conductive tape 62 manufactured by 3M Company was attached to a conductive part for the lead wire connection that was previously covered with the mask 66 on this electrode, resulting in a lead wire. The conductive tape was also attached to the entirety of the rear side of the substrate.

Further, as shown in FIG. 9B, a kapton tape 63 to be attached to the side where the electrode was formed, which has the kapton tape attached to the entirety thereof, has a hole with Φ6 mm at the object electrode part in order that the conductive tape is electrically insulated, and the rear side thereof was entirely covered with the kapton tape.

Subsequently, a filament tape 64 manufactured by 3M Company was attached to fix the kapton tape. The filament tape also has a hole with Φ6 mm on the electrode formation side at the object electrode part. FIG. 9C is a diagram thereof viewed from the above.

Further, a reagent used in the electrochemical measurement at this time is potassium hexacyanoferrate (II), which is used for observing a general oxidation-reduction response.

This electrode having the columnar structured materials was used as an acting electrode 73, and a current response was measured using a CV (cyclic voltammetry) method. At this time, a platinum wire was used for a counter electrode 72, and Ag/AgCl was used for a reference electrode 71. A 10 mM potassium hexacyanoferrate (II) aqueous solution as an electroplating solution 75 was poured in a beaker 74 to perform the measurement. At this time, 1.0 M potassium chloride was used for a supporting electrolyte. An oxidation peak current value and a reduction peak current value were both about 2.5 mA/cm$^2$; as compared with peak current values when using a commercially available platinum disk electrode, the values of the electrode having the columnar structured materials were increased by about 25%. It is conceivable that this is based on an effect of increase in the surface area owing to the formation of the columnar structure, and it is suggested that this is useful for a high-sensitive detection.

Example 5

This example relates to an example in which a silicon substrate having gold thereon is used as a substrate, aluminum and germanium are used as materials which form a eutectic, and gold is filled, through electrodeposition followed by electroless deposition, in microholes of a porous germanium that is obtained by removing aluminum columns in a film.

Through the RF magnetron sputtering, an aluminum-germanium mixture film was formed into a thickness of 200 nm on a silicon substrate having gold deposited thereon at 50 nm. A target used has the same structure as that used in Example 4, which is shown in FIG. 4; instead of the silicon chips of Example 4, germanium chips are arranged. In this example, four germanium chips were arranged on an aluminum target. The sputtering was performed using the RF power supply under conditions of an Ar flow rate: 50 sccm, a discharge pressure: 0.7 Pa, and a starting power: 1 kW. In addition, the substrate temperature was set to the room temperature.

Here, as the target, one having four germanium chips arranged on an aluminum target was used. However, the number of the germanium chips is not limited thereto because it varies according to the sputtering conditions, and any number may be used as long as a desired structure can be formed with aluminum columns being dispersed in germanium, as described below. In addition, the target is not limited to one having germanium chips arranged on an aluminum target, and it may be one having aluminum chips arranged on a germanium target, or a target obtained by baking germanium and aluminum powders may be used.

Further, the RF sputtering was used as a sputtering method here. However, the sputtering method is not limited thereto, and may be the ECR sputtering method, the DC sputtering method, or the ion beam sputtering method. Further, the sputtering conditions depend on an apparatus and are not limited thereto. In addition, even among vapor deposition methods other than the sputtering method, any methods with which a desired structure can be formed may be applied to the present invention.

Next, the aluminum-germanium mixture film thus obtained was analyzed concerning the fractional amount (atomic %) of germanium with respect to the total amount of aluminum and germanium through the ICP (induction-coupled plasma emission spectrometry). As a result, it was found that the fractional amount of germanium was about 37 atomic % with respect to the total amount of aluminum and germanium.

The aluminum-germanium mixture film produced as described above was observed with the field emission scanning electron microscope (FE-SEM). Similarly to the shape shown in FIG. 5 in Example 4, the shape of the surface obliquely viewed from directly above the substrate was in such a condition that substantially circular aluminum microcolumns surrounded by germanium members were arranged two-dimensionally. The average hole diameter $2r$ found by performing image processing for the aluminum column parts was 10 nm, and the average center-to-center interval $2R$ was 15 nm. In addition, when the cross section thereof was observed with the FE-SEM, the height of the film was 200 nm, and the respective aluminum column parts were independent of each other. In addition, when this thin film sample was analyzed through the X-ray diffraction method, any diffraction line of germanium was not verified, and it was found that germanium was amorphous. On the other hand, a plurality of diffraction lines of aluminum were verified, and it was therefore found that aluminum was polycrystalline.

Based on the above, production of the aluminum-germanium structured material thin film was verified, which contained crystalline aluminum columns whose vicinities were surrounded by amorphous germanium and which had the interval $2R$ of 15 nm, the diameter $2r$ of 10 nm, and a height L of 200 nm.

This aluminum-germanium structured material thin film was immersed in 98% sulfuric acid for 24 hours, and etching was selectively performed for the aluminum columnar structure parts to form microholes. As a result of the observation with the FE-SEM for the film after the etching, it was verified that only the aluminum columns were removed, and the film became porous. It was found that the shape of the germanium part was not substantially changed as compared with its state before the aluminum removal. In this case as well, when the cross section thereof was observed with the FE-SEM, it became apparent that aluminum was completely removed up to the substrate interface. By following the above steps, the porous germanium film having on the substrate the through holes perpendicular to the substrate could be produced.

Next, gold columnar structured materials were produced through electrodeposition followed by electroless deposition in the microholes of the porous film produced in the above-mentioned manner. First, an alternating current (35 V, 50 Hz) electrolysis was performed in an electrolytic solution composed of 0.14 M $NiSO_4$ and 0.5 M $H_3BO_3$ to deposit nickel at the bottom of the microholes. After that, this was put in an electroless deposition plating solution for gold (electroless deposition plating solution for gold produced by Kojundo Chemical Laboratory Co., Ltd.; product code: K-24N) of a neutral bath kept at 70° C. (pH=7.0), and gold deposition layers were formed over the entirety of the microholes. In this process, it is conceivable that nickel previously deposited at the bottom of the microholes through the alternating current electrolysis functions as a catalyst, and rapid filling of gold into the microholes occurs.

As a result of the observation with the FE-SEM for the surface and the cross section of the thin film after the gold filling, it was verified that gold was uniformly filled in the microholes.

This film was immersed in concentrated nitric acid to remove germanium in the vicinity of gold. As a result of the observation with the FE-SEM for the silicon film after the germanium removal, it was verified that the gold columnar microstructured materials were formed on the surface at a high density.

Next, a processing method of using the produced electrode as an acting electrode in an electrolytic solution was the same as that of Example 4.

Further, a reagent used in the electrochemical measurement at this time is ferrocene, which is used for observing a general oxidation-reduction response.

This electrode having the columnar structured materials was used as the acting electrode 73, and a current response was measured using the CV (cyclic voltammetry) method. At this time, a platinum wire was used for the counter electrode 72, and $I^-/I^{3-}$ was used for the reference electrode 71. 10 mM ferrocene was dissolved in an acetonitrile solution as the electroplating solution 75, which was poured in the beaker 74 to perform the measurement. At this time, 1.0 M TBAP (tetrabutylammonium perchlorate) was used for a supporting electrolyte. An oxidation peak current value and a reduction peak current value were both about 2.0 mA/cm$^2$; as compared with peak current values at the time of using the commercially available platinum disk electrode, the values of the electrode having the columnar structured materials were increased by about 15%. It is conceivable that this is based on an effect of increase in the surface area owing to the formation of the columnar structure, and it is suggested that this is useful for the high-sensitive detection.

Example 6

This example relates to an example in which a silicon substrate having tungsten on its surface is used, aluminum and silicon are used as materials which form a eutectic, aluminum columns in a film are removed to obtain a porous silicon film, which is thereafter subjected to oxidation processing to obtain a porous oxidized silicon film, platinum columnar structured materials and conductive materials being produced through electrodeposition.

First, an aluminum-silicon mixture film, which is the same as that produced in Example 4, was formed on a silicon substrate having 20 nm of tungsten deposited thereon under the same conditions as those of Example 4. Etching processing with 98% sulfuric acid was performed on this film under the same conditions as those of Example 4 to selectively remove aluminum. Further, the porous oxidized silicon film thus obtained was thermally oxidized under the same conditions as those of Example 4 to obtain the porous oxidized silicon film. By use of evaluation means similar to those of Example 4 such as the observation with the FE-SEM, it was verified that the porous oxidized silicon film similar to that of Example 4 was formed.

Platinum columnar structured materials were produced through the electrodeposition (electroplating) from the bottom of this porous oxidized silicon film. The porous oxidized silicon thin film produced in the above steps was put in a commercially available electroplating solution (electroplating solution for platinum produced by Kojundo Chemical Laboratory Co., Ltd.; product code: PT-100E), and the electrodeposition was performed at a current density of 1.5 A/dm$^2$ in an acid bath kept at 70° C. (pH=0.1) for 120 seconds in an acid bath kept at 70° C. (pH=0.1), thereby depositing platinum on the oxidized silicon film as well as in the holes. The substrate after the electrodeposition was thoroughly rinsed with pure water and then dried. At this time, it was found that platinum overflowed from the holes by performing the electrodeposition for a long period of time, which resulted in a thin film on the oxidized silicon film. This is conceivable to be that because a distance between one hole and another hole is close, and thus after electrodeposited platinum overflows from the holes, its growth progresses in a lateral direction as well, so that the entire surface is covered therewith.

The film after the platinum electrodeposition was rinsed with pure water, and thereafter the surface and the cross section thereof were observed with the FE-SEM. As a result, it was verified that platinum was introduced into the microholes uniformly, and a columnar structure was formed. In addition, it was verified that the surface was also covered with platinum.

The substrate having platinum formed in the holes and on the surface was subjected to oxidized silicon removal with a 2% hydrofluoric acid aqueous solution similarly to Example 4. Further, it was immersed for 30 seconds in a solution prepared by dissolving 10 g of sodium ferricyanide in 100 mL of distilled water to separate platinum from the substrate, thereby removing tungsten. As a result of the observation with the FE-SEM for the electrode after removing the oxidized silicon and the silicon substrate removal, it was verified that aggregations of the platinum columnar microstructured materials were formed on platinum at a high density, and thus the formation of the columnar structured materials through the above steps was verified.

Figure 9C:
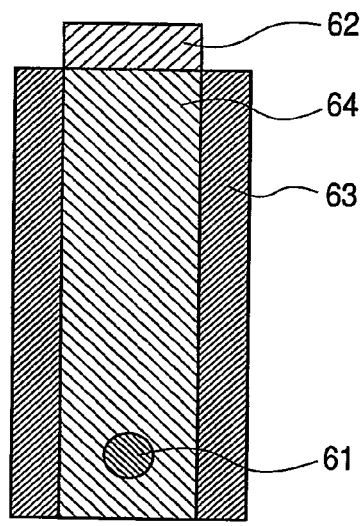

Next, an actual electrode was produced with the same method as that of FIGS. 9A to 9C in order to use the produced electrode as an acting electrode in an electrolytic solution.

In this example, an epoxy resin was used instead of an $SiO_2$ vapor deposition film, and the area other than the measurement area with Φ6 mm was insulated.

Next, description will be made of a measurement method while referring to FIG. 10.

A reagent used in the electrochemical measurement at this time is potassium hexacyanoferrate (II), which is used for observing a general oxidation-reduction response.

This electrode having the columnar structured materials was used as the acting electrode 73, and a current response measurement was performed similarly to Example 4 by using the CV (cyclic voltammetry) method. An oxidation peak current value and a reduction peak current value were both about 2.5 $mA/cm^2$; as compared with peak current values when using the commercially available platinum disk electrode, the values of the electrode having the columnar structured materials were increased by about 25%. It is conceivable that this is based on an effect of increase in the surface area owing to the formation of the columnar structure, and it is suggested that this is useful for the high-sensitive detection.

As described above, according to the present invention, by utilizing the film that has the structure in which one component is dispersed in the form of microcolumns in another component, which is produced by means of sputtering or the like using a target with an appropriate component ratio, and introducing an object material into the holes obtained by removing the columnar components, the microcolumnar structured materials having desired materials can be produced.

In addition, according to the present invention, by utilizing the film that has the structure in which one component is dispersed in the form of microcolumns in another component, which is produced by means of sputtering or the like using a target with an appropriate component ratio, and introducing an object material into the holes, the microcolumnar structured materials can be produced on a conductive material, thereby making it possible to use this as the electrode. Further, this electrode having the columnar structured materials can be produced with the simple method, and also it is possible to provide the electrode capable of measuring a current value at high sensitivity with high accuracy.

The invention claimed is:

1. A method for producing an electrode having a plurality of columnar members, comprising:
    a step of preparing a structured material in which columnar-shaped substances containing aluminum are dispersed in an amorphous matrix member containing silicon or germanium capable of forming a eutectic with aluminum by a sputtering process;
    a removing step of removing the columnar-shaped substances for forming columnar holes;
    an introducing step of introducing a conductive filler into the columnar holes;
    a step of removing the amorphous matrix member to form a structure in which a plurality of columnar members including the conductive filler are arranged on a substrate; and
    a step of providing a conductive material to the structure from a side opposite to the substrate to electrically connect the conductive material to the plurality of columnar members.

2. The method according to claim 1, further comprising a step of subjecting the structured material to a chemical treatment after the removing step.

3. The method according to claim 1, wherein the removing step is performed by etching.

4. The method according to claim 1, further comprising a step of processing the plurality of columnar members to change their size.

5. The method according to claim 1, further comprising a step of forming an insulator to a part of the plurality of columnar members.

\* \* \* \* \*